United States Patent
Takeda et al.

(10) Patent No.: US 10,199,552 B2
(45) Date of Patent: Feb. 5, 2019

(54) LIGHT EMITTING DEVICE AND ELECTRONIC COMPONENT

(71) Applicant: TOYODA GOSEI CO., LTD., Kiyosu-shi (JP)

(72) Inventors: Shigeo Takeda, Kiyosu (JP); Shota Shimonishi, Kiyosu (JP); Hideaki Kato, Kiyosu (JP); Tomohiro Miwa, Kiyosu (JP); Daisuke Kato, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/648,344

(22) Filed: Jul. 12, 2017

(65) Prior Publication Data

US 2018/0090650 A1    Mar. 29, 2018

(30) Foreign Application Priority Data

Sep. 29, 2016  (JP) .................. 2016-191475
May 8, 2017    (JP) .................. 2017-092634

(51) Int. Cl.
| | |
|---|---|
| *H01L 33/62* | (2010.01) |
| *H01L 33/64* | (2010.01) |
| *H01L 25/075* | (2006.01) |
| *H01S 5/022* | (2006.01) |
| *H01S 5/024* | (2006.01) |
| *H01S 5/40* | (2006.01) |
| *H01L 33/50* | (2010.01) |
| *H01S 5/00* | (2006.01) |

(52) U.S. Cl.
CPC .......... *H01L 33/62* (2013.01); *H01L 25/0753* (2013.01); *H01L 33/644* (2013.01); *H01L 33/647* (2013.01); *H01S 5/02272* (2013.01); *H01S 5/02469* (2013.01); *H01S 5/4025* (2013.01); *H01L 33/505* (2013.01); *H01S 5/005* (2013.01)

(58) Field of Classification Search
None
See application file for complete search history.

(56) References Cited

U.S. PATENT DOCUMENTS

| | | | |
|---|---|---|---|
| 7,821,023 B2 | 10/2010 | Yuan et al. | |
| 8,796,706 B2 | 8/2014 | Jung et al. | |
| 9,048,391 B2 | 6/2015 | Jung et al. | |
| 9,257,624 B2 | 2/2016 | Jung et al. | |
| 9,472,743 B2 | 10/2016 | Jung et al. | |
| 2012/0002420 A1* | 1/2012 | Imai | H01L 33/486 362/249.02 |
| 2015/0340575 A1* | 11/2015 | Nakabayashi | H01L 33/486 257/91 |

FOREIGN PATENT DOCUMENTS

| | | |
|---|---|---|
| JP | 2013-179302 A | 9/2013 |
| JP | 2014-229676 A | 12/2014 |
| WO | WO 2011/002208 A2 | 1/2011 |

* cited by examiner

*Primary Examiner* — Eva Y Montalvo
*Assistant Examiner* — Kevin Quinto
(74) *Attorney, Agent, or Firm* — McGinn I.P. Law Group, PLLC

(57) ABSTRACT

A light emitting device includes a wiring substrate, a light emitting element disposed on a front surface of the wiring substrate, and a conductor pattern formed on a rear surface of the wiring substrate. The conductor pattern includes a slit or a hole that fails to separate the conductor pattern into two parts.

16 Claims, 23 Drawing Sheets

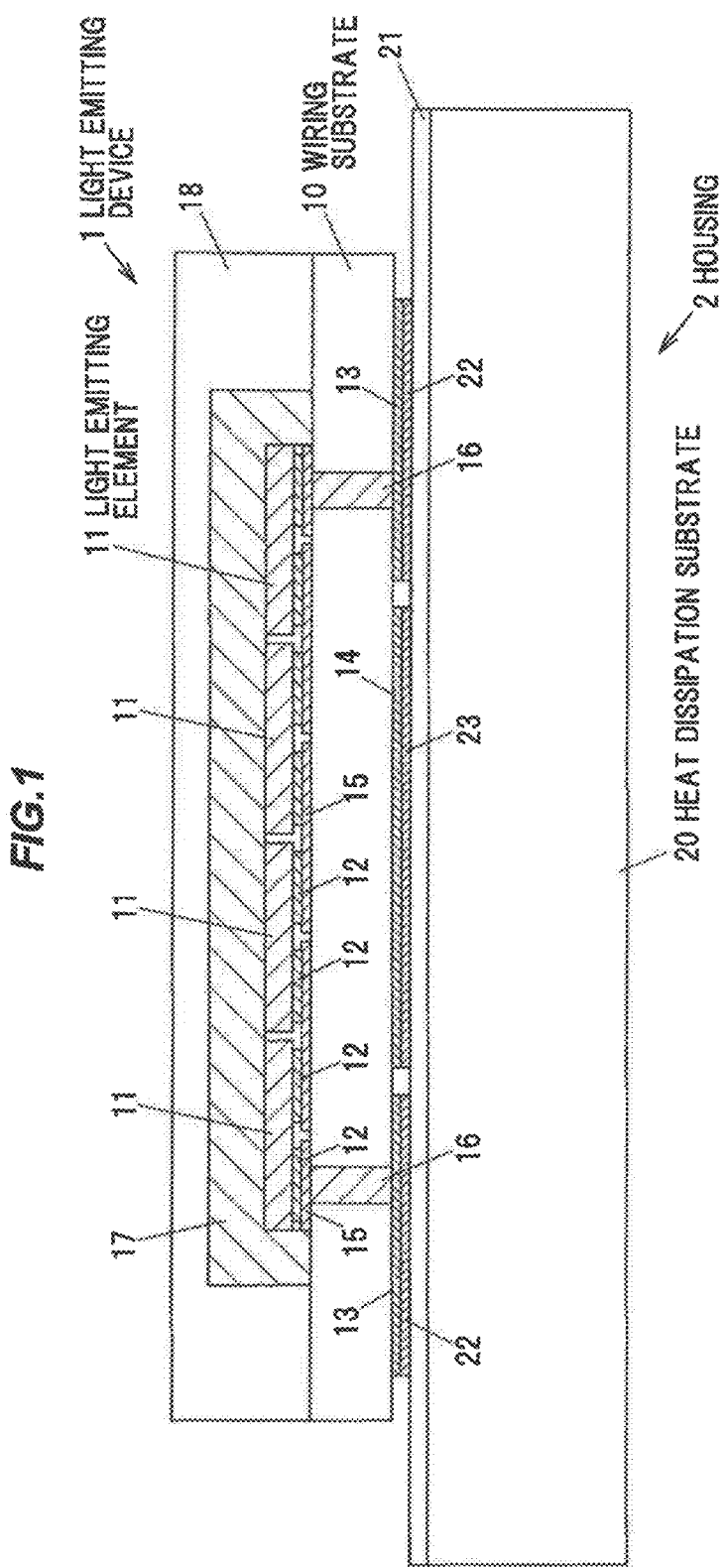

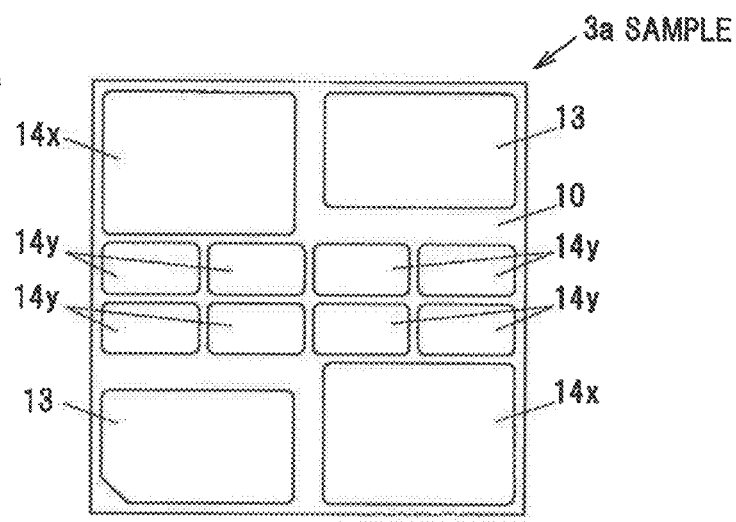
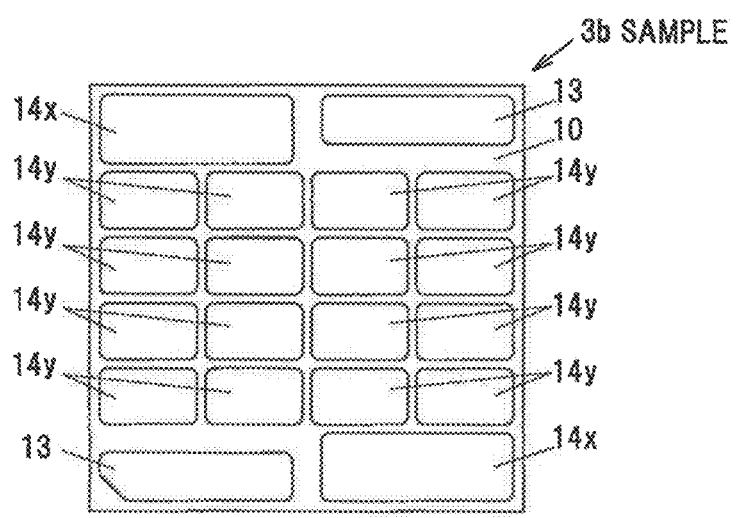
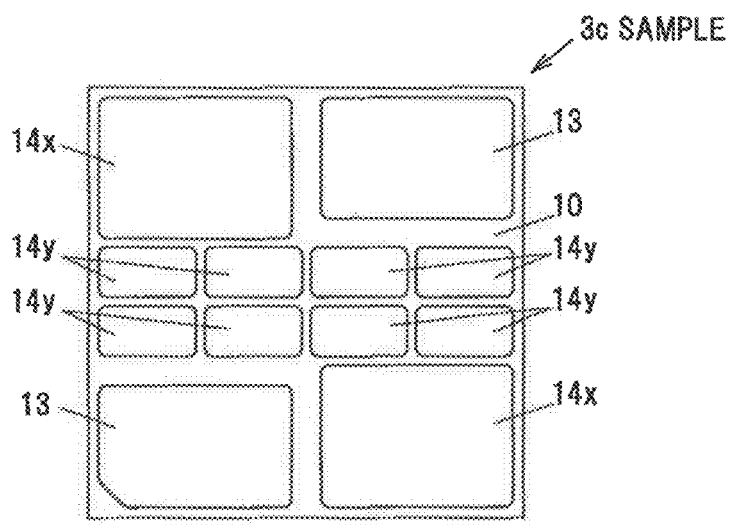

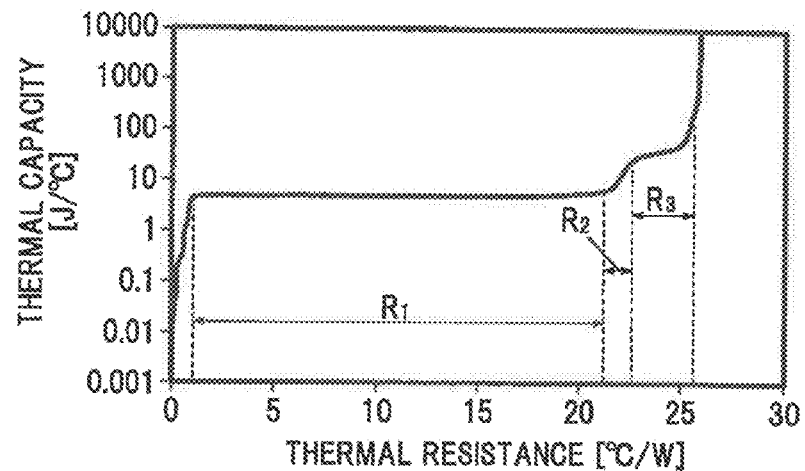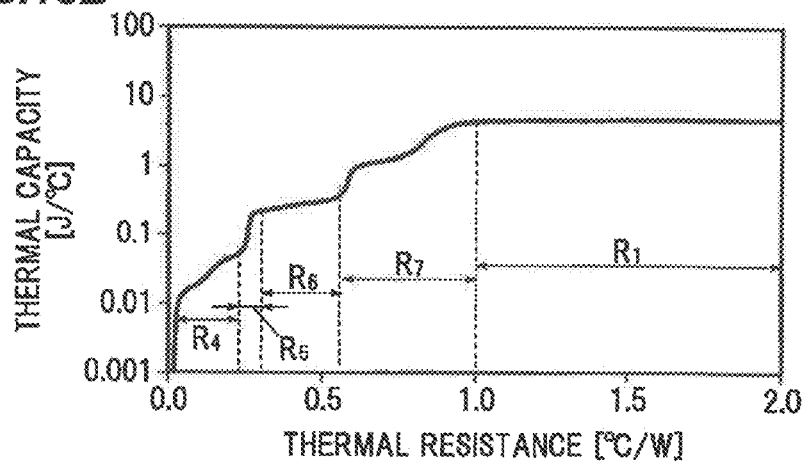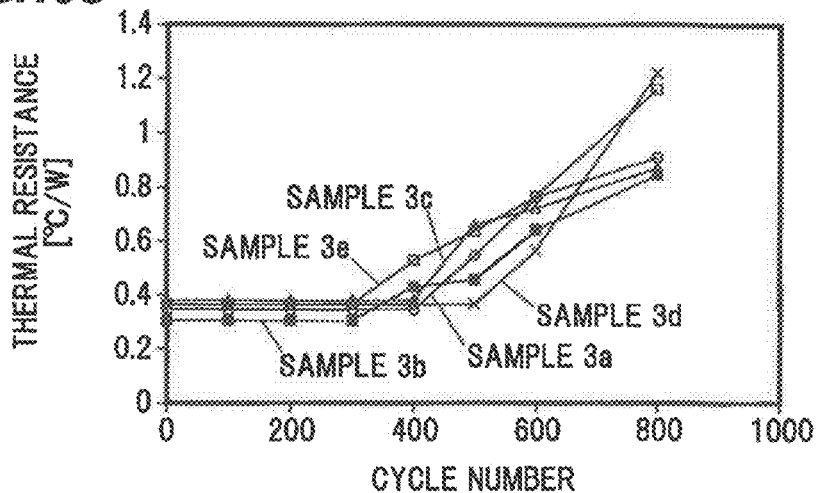

LIGHT EMITTING DEVICE AND ELECTRONIC COMPONENT

The present application is based on Japanese patent application Nos. 2016-191475 and 2017-092634 filed on Sep. 29, 2016 and May 8, 2017, respectively, the entire contents of which are incorporated herein by reference.

BACKGROUND OF THE INVENTION

1. Field of the Invention

This invention relates to a light emitting device and an electronic component.

2. Description of the Related Art

A light emitting device is known in which is a Chip On Board (COB) type light emitting device and arranges a conductor pattern for conduction and a conductor pattern for heat dissipation on a rear surface of a substrate (see e.g. JP-A-2013-179302 and WO2011/002208). The light emitting device is installed in a housing by jointing the conductor pattern on the rear surface of the substrate with a housing side conductor pattern.

According to JP-A-2013-179302 and WO2011/002208, power can be supplied from the housing side conductor pattern to a light emitting element through the conductor pattern for conduction, and heat caused in the light emitting device can be effectively emitted to, for example, a housing side heat sink through the conductor pattern for heat dissipation.

SUMMARY OF THE INVENTION

The COB type light emitting device described in JP-A-2013-179302 and WO2011/002208 has a difference in a linear expansion coefficient between a light emitting device substrate and a housing substrate in which the light emitting device is installed. Thus, a junction between the light emitting device and the housing cracks by repeatedly lighting on and off with temperature change.

The light emitting element mounted on the light emitting device disconnects with a power source when the conductor pattern for conduction is separated caused by cracking. Also, heat dissipation characteristic becomes worse and the life of the light emitting element decreases when the conductor pattern for heat dissipation cracks.

If a bubble enter into a space between the conductor patterns in the light emitting device and the housing, the bubble may cause adverse effects for conduction and heat dissipation. Having the conductor pattern for heat dissipation as with the light emitting device disclosed by JP-A-2013-179302 and WO2011/002208, the light emitting device has the conductor pattern for heat dissipation whose area is normally larger than the conductor pattern for conduction. Therefore, the bubble is difficult to remove and likely to be remained.

It is an object of the invention to provide a light emitting device and an electronic component that prevent the crack in the conductor pattern and the remaining bubble to occur at the junction with a housing, where the light emitting device and the electronic component are used by being attached to the housing.

According to embodiments of the invention, a light emitting device and an electronic component defined by [1] to [6] and [7] below respectively are provided.

[1] A light emitting device, comprising:
a wiring substrate;
a light emitting element disposed on a front surface of the wiring substrate; and
a conductor pattern formed on a rear surface of the wiring substrate, wherein the conductor pattern comprises a slit or a hole that fails to separate the conductor pattern into two parts.

[2] The light emitting device according to [1], wherein the conductor pattern comprises a conduction pattern that is electrically connected to the light emitting element and a heat dissipation pattern.

[3] The light emitting device according to [1] or [2], wherein the slit opens at an edge of the conductor pattern that is not on an outer periphery of the conductor pattern.

[4] The light emitting device according to any one of [1] to [3], wherein the slit of the heat dissipation pattern opens toward the conductor pattern.

[5] The light emitting device according to any one of [1] to [4], wherein a length of each part of a side of the conductor pattern separated by the slit is not less than three times as long as a width of the slit.

[6] The light emitting device according to any one of [1] to [5], wherein a width of a narrowest part of the conductor pattern is not less than 1.125 mm.

[7] An electronic component for being attached to an outside housing, wherein the electronic component comprises a substrate, and a conductor pattern formed on one surface of the substrate so as to connect to the housing therethrough, and
wherein the conductor pattern comprises a slit or a hole that fails to separate the conductor pattern into two parts.

Effects of the Invention

According to embodiments of the invention, a light emitting device and an electronic component can be provided that prevents the crack in the conductor pattern and the remaining bubble to occur at the junction with a housing, where the light emitting device and the electronic component are used by being attached to the housing.

BRIEF DESCRIPTION OF THE DRAWINGS

Next, the present invention will be explained in conjunction with appended drawings, wherein:

FIG. 1 is a longitudinal sectional view showing a light emitting device according to the first embodiment;

FIG. 10A is a plan view showing a conductor pattern in the first sample used for an assessment according to an example 1;

FIG. 10B is a plan view showing the conductor pattern in the second sample used for the assessment according to the example 1;

FIG. 10C is a plan view showing the conductor pattern in the third sample used for the assessment according to the example 1;

FIG. 15A is a graph showing a relation between thermal resistance and thermal capacity at each part of the sample and the housing;

FIG. 15B is a graph showing the relation between the thermal resistance and the thermal capacity at each part of the sample and the housing; and FIG. 15C is a graph showing a thermal resistance change at the junction made of solder between a light emitting device side conductor pattern made of Cu and a housing side conductor pattern made of Cu;

DETAILED DESCRIPTION OF THE PREFERRED EMBODIMENTS

First Embodiment

Figure 2A:
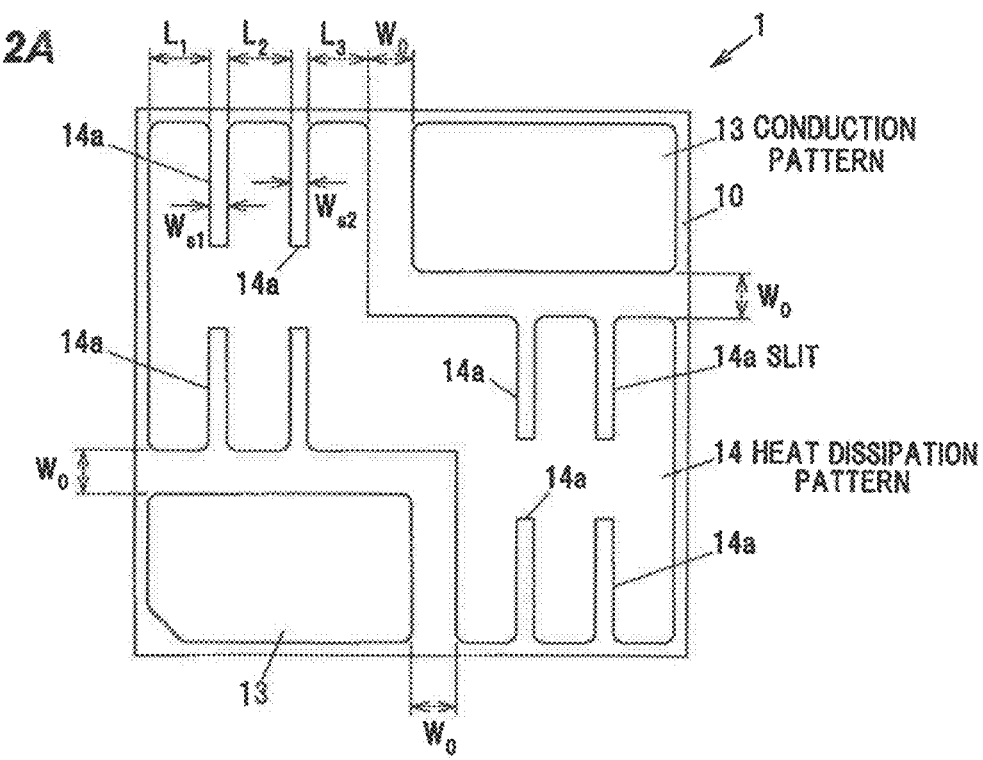
FIG. 2A is a plan view showing a rear surface side of the light emitting device showing a conductor pattern shape.

FIG. 1 is a longitudinal sectional view showing a light emitting device 1 according to the first embodiment. The light emitting device 1 is a Chip on Board (COB) type light emitting device. The light emitting device 1 is provided with a wiring substrate 10, a light emitting element 11 disposed on the front surface of the wiring substrate 10, and a conductor pattern having a conduction pattern 13 electrically connected to the light emitting element 11 and a heat dissipation pattern 14, which is formed on the rear surface of the wiring substrate 10.

A phosphor layer 17 covers a top surface and a side surface of the light emitting element 11. A sealing material 18 covers a surface of the phosphor layer 17.

For example, the wiring substrate 10 is a ceramic substrate such as $Al_2O_3$ substrate and AlN substrate, a metallic substrate of which an insulating film covers the front surface such as Al substrate and Cu substrate, or a glass epoxy substrate. The wiring substrate 10 has wiring on the front surface (not shown), which is, for example, made of Cu.

For example, the light emitting element 11 is a light emitting diode (LED) chip or a laser diode chip. The light emitting element 11 is typically a flip-chip type light emitting element. Meanwhile, the light emitting element 11 may be a face-up type light emitting element. A number and an arrangement of the light emitting element 11 are not limited.

An electrode 12 of the light emitting element 11 is connected to the wiring 15 on the front surface of the wiring substrate 10. The electrode 12 is electrically connected to the conduction pattern through a via hole 16 that pierces the wiring substrate 10 in the thickness direction.

The conductor pattern composed of the conduction pattern 13 and the heat dissipation pattern 14 is a thin film pattern made of the conductor such as Cu. For example, the conductor pattern is formed by pattering a conductor film formed on the rear surface of the wiring substrate 10. In this case, the conduction pattern 13 and the heat dissipation pattern 14 are made of same material and have same thickness.

The heat dissipation pattern 14 is disposed so as to emit heat in the light emitting device 1 for housing 2 side. The heat dissipation pattern 14 is not needed to be connected to the wiring 15 on the front surface of the wiring substrate 10 through, for example, the via hole. Meanwhile, the heat dissipation pattern 14 may be connected to the wiring 15 so as to increase the heat dissipation performance.

The light emitting device 1 is applied by installing in a housing 2. The housing 2 is provided with a heat dissipation substrate 20, for example, which is made of Al, an insulating substrate 21 disposed on the heat dissipation substrate 20, for example, which is made of glass epoxy, and a conductor pattern having a conduction pattern 22 and a heat dissipation pattern 23, which are formed on the insulating substrate 21.

The conduction pattern 13 in the light emitting device 1 is connected to the conduction pattern 22 of the housing 2 by using conductive adhesive such as solder. Power is supplied from the housing 2 side to the light emitting element 11 through the conduction pattern 22 and the conduction pattern 13.

The heat dissipation pattern 14 in the light emitting device 1 is connected to the heat dissipation pattern 23 of the housing 2 by using the conductive adhesive such as the solder. Heat emitted from the light emitting device 1 conducts for the housing 2 side through the heat dissipation pattern 14 and the heat dissipation pattern 23. Then, heat is mainly emitted from the heat dissipation substrate 20 for outside.

Meanwhile, a junction between the light emitting device 1 and the housing 2 (the conduction pattern 13, the heat dissipation pattern 14, the conduction pattern 22, the heat dissipation pattern 23, and the conductive adhesive) cracks caused by repeatedly lighting on and off with temperature change since the wiring substrate 10 of the light emitting device 1 and the heat dissipation substrate 20 of the housing 2 have a difference in a linear expansion coefficient.

A phosphor layer 17 is formed from a transparent member such as a resin in which phosphor particles are distributed. The phosphor color included in the phosphor layer 17 is not limited thereof. The light emitting element 11 serves as an exciting source for phosphor included in the phosphor layer 17. The mixing color with the light emission color of the light emitting element 11 and the light emission color of the phosphor layer 17 is the light emission color of the light emitting device 1. For example, the light emission color of the light emitting device 1 is white when the light emission color of the light emitting element 11 is blue and the light emission color of the phosphor layer 17 is yellow.

The sealing material 18 is made of the transparent resin such as the silicone resin and the epoxy resin. It is preferable to lower refractive index of the sealing material 18 than refractive index of the phosphor layer 17 so as to increase light extraction efficiency.

FIG. 1 is a schematic view showing a configuration of the light emitting device 1. FIG. 1 does not mean that the light emitting device 1 actually has the cross section shown in FIG. 1. That is, an arrangement of the light emitting element 11 of the light emitting device 1 and the conductor pattern do not have influence by FIG. 1.

Figure 2B:
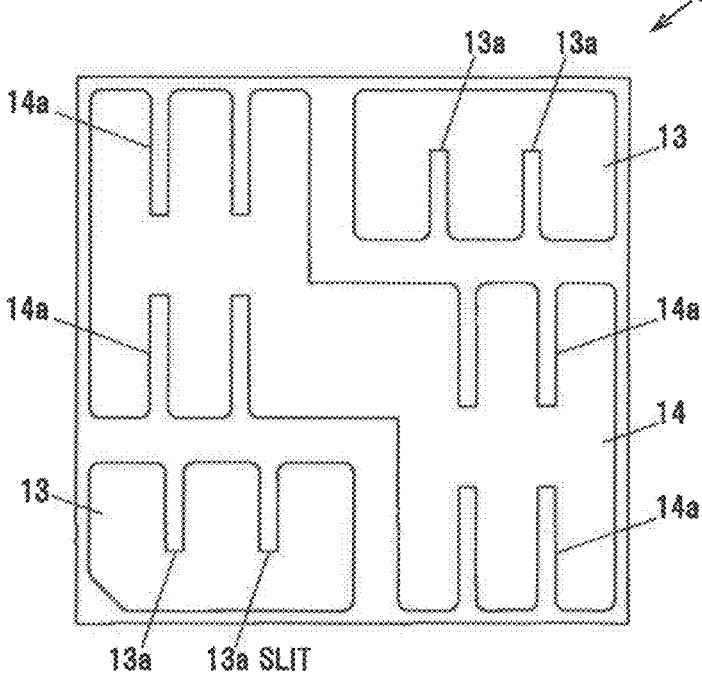
FIG. 2B is a plan view showing the rear surface side of the light emitting device showing the conductor pattern shape.

FIGS. 2A and 2B are plan views showing a rear surface side of the light emitting device 11 showing a conductor pattern shape. As shown in FIGS. 2A, 2B, the conductor pattern has a slit that fails to separate the conductor pattern.

FIG. 2A shows an example that the heat dissipation pattern 14 has a slit 14a. FIG. 2B shows an example that the conduction pattern 13 has a slit 13a and the heat dissipation pattern 14 has the slit 14a. Meanwhile, the conduction pattern 13 in the conductor pattern may only have the slit 13a.

Bubbles hardly remains in a space between the conductor pattern in the light emitting element 1 and the conductor pattern in the housing 2 since the slit formed in the conductor pattern emits the bubbles. That is, the slit 14a can control remaining the bubbles in the space between the heat dissipation pattern 14 and the heat dissipation pattern 23. Also, the slit 13a can control remaining the bubbles in the space between the conduction pattern 14 and the conduction pattern 23. Therefore, the worsening conduction and heat dissipasivility caused by the bubbles can be controlled.

Outer peripheral length of the conductor pattern increases by disposing the slit in the conductor pattern, which fails to separate the conductor pattern. That is, outer peripheral length of the heat dissipation pattern 14 increases caused by the slit 14a. Also, outer peripheral length of the conduction pattern 13 increases caused by the slit 13a.

Inventors newly find through diligent research that "cracking caused by the difference in the linear expansion coefficient between the wiring substrate 10 of the light emitting device 1 and the heat dissipation substrate 20 of the housing 2 can be controlled as the outer peripheral length of each part of the conductor pattern increases. And a cycle number of lighting on and off until the conductor pattern is separated by cracking increases significantly".

That is, forming the slit 13a and the slit 14a can control cracking in the conduction pattern 13 and the heat dissipation pattern 14. As the slit 13a controls cracking in the conduction pattern 13, a cycle number until the light emitting element 11 is disconnected can be increased so as to extend the life of the light emitting elements 11. Also, as the slit 14a controls cracking in the heat dissipation pattern 14, the worsening of the heat dissipation property can be controlled so as to extend the life of the light emitting elements 11.

It is preferable to form the slit 13a and the slit 14a nearly perpendicular to a side of the outer periphery so as not to form extreme narrow areas in the heat dissipation pattern 14 and the conduction pattern 13. The narrow area is easy to separate caused by cracking. The narrow area may increase adverse effect caused by cracking.

Figure 3:
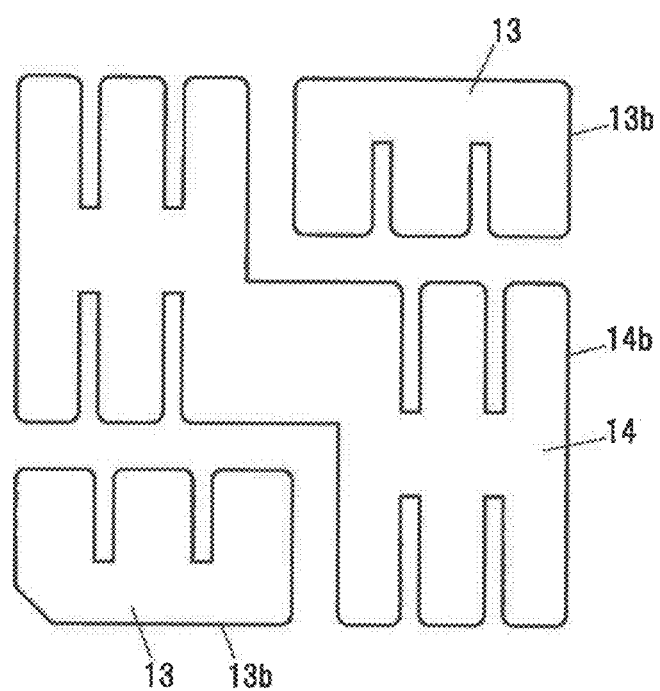
FIG. 3 is a schematic view showing an outer periphery of a heat dissipation pattern and an outer periphery of a conduction pattern.

FIG. 3 is a schematic view showing the outer periphery of the heat dissipation pattern 14 and the outer periphery of the conduction pattern 13 using the conductor pattern shown in FIG. 2B as an example. The edge 14b shown in FIG. 3 is an edge of the heat dissipation pattern 14 that configures the outer periphery of the heat dissipation pattern 14. The edge 13b shown in FIG. 3 is an edge of the conduction pattern 13 that configures the outer periphery of the conduction pattern 13.

Figure 4:
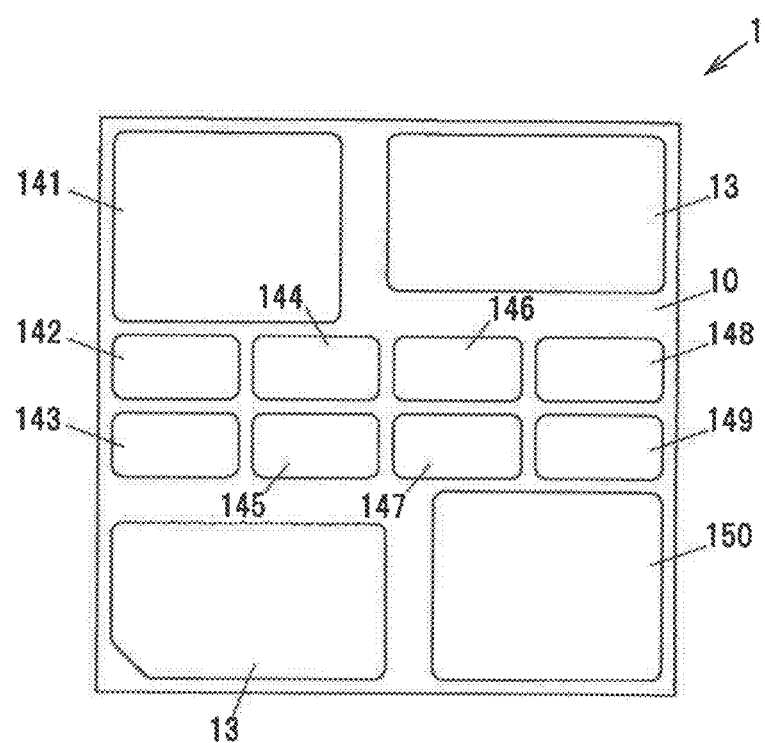
FIG. 4 is a plan view showing an example of a conductor pattern in which a slit to separate is disposed.

FIG. 4 is a plan view showing an example of the conductor pattern in which the slit to separate is disposed. In the example shown in FIG. 4, the slits separate the heat dissipation pattern 14 into the heat dissipation patterns 141 to 150.

Although the slit separates the heat dissipation pattern 14, an effect to control remaining the bubbles can be obtained. Further, one heat dissipation pattern whose outer peripheral length is long changes into a cluster of a plurality of heat dissipation patterns whose outer peripheral length is short while the slit fails to affect the heat dissipation performance so much. That is, the heat dissipation pattern 14 is the cluster of the plurality of patterns, which are prone to crack.

Therefore, the slit formed in the conductor pattern must not separate the conductor pattern as with the slit 14a and the slit 13a. Meanwhile, slit shapes of the slit 14a and the slit 13a are not limited to the linear shape shown in FIGS. 2A, 2B.

Figure 5A:
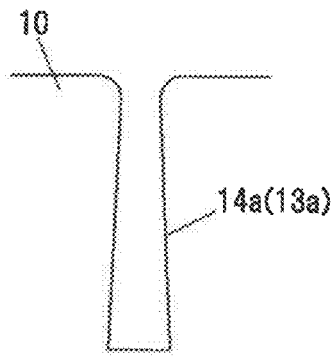
FIG. 5A is a plan view showing an example of a slit shape.
Figure 5B:
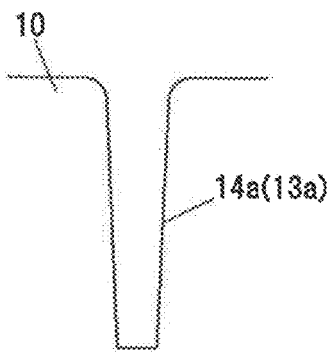
FIG. 5B is a plan view showing the example of the slit shape.
Figure 5C:
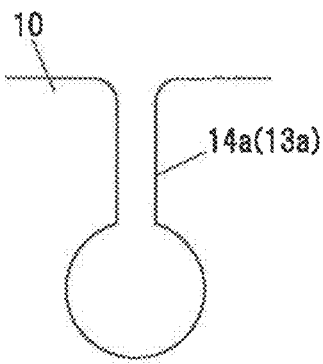
FIG. 5C is a plan view showing the example of the slit shape.

FIGS. 5A, 5B, and 5C are plan views showing an example of the slit shape. As shown in FIGS. 5A, 5B, the slit shape of the slit 14a and the slit shape of the slit 13a may be a shape that increases its width gradually toward the bottom of the slit or decreases its width gradually toward the bottom of the slit. Also, as shown in FIG. 5C, the slit shape of the slit 14a and the slit shape of the slit 13a may expand the bottom of the slits. The slit shape at expanding part is a spherical shape in the example shown in FIG. 5C. However, the slit shape is not limited to. Remaining bubbles with using the minimum size of the slit can control by setting the slit shapes of the slit 14a and the slit 13a corresponding to a conduction pattern shape.

Width of a part of the conductor pattern that is separated by the slit is preferable to have certain width so as to control separating the conductor pattern caused by cracking. For example, length of each part of a side $L_1$, $L_2$, $L_3$ of the heat dissipation pattern 14 separated by the slit 14a shown in FIG. 2A are set more than three times as long as the width of the slits $Ws_1$, $Ws_2$ (the maximum width if the slit widths is not constant). Also, in some cases, the condition that the lengths $L_1$, $L_2$, $L_3$ are more than the width of the space $W_0$ between the conduction pattern 13 and the heat dissipation pattern 14 may be added. The widths $L_1$, $L_2$, $L_3$ are typically equal. However, these may not be equal. Length of each part of the side of the conduction pattern 13 separated by the slit 13a are similar.

Second Embodiment

The second embodiment is different from the first embodiment in the number of the slits of the conductor pattern. Furthermore, the explanation of the same as in the first embodiment is omitted or simplified below.

Figure 6A:
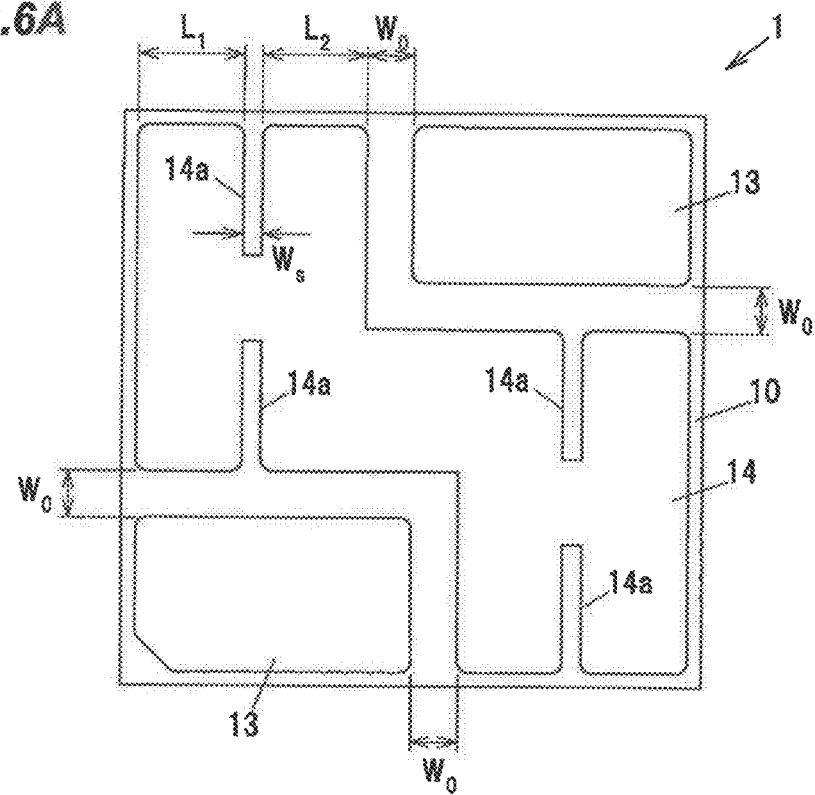
FIG. 6A is a plan view showing a rear surface side of the light emitting device showing a conductor pattern shape according to the second embodiment.
Figure 6B:
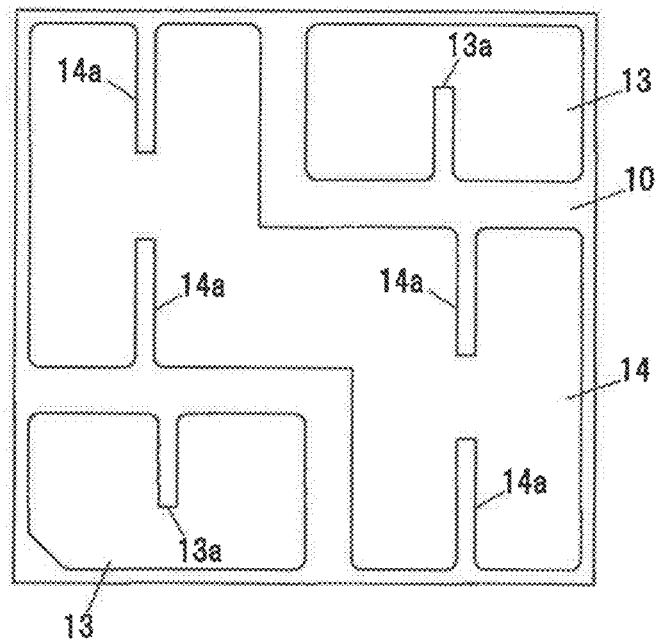
FIG. 6B is a plan view showing the rear surface side of the light emitting device showing the conductor pattern shape according to the second embodiment.

FIGS. 6A, 6B are plan views showing a rear surface side of the light emitting device 1 showing a conductor pattern shape according to the second embodiment FIG. 6A shows an example that the heat dissipation pattern 14 has the slit 14a. FIG. 6B shows an example that the conduction pattern 13 has the slit 13a and the heat dissipation pattern 14 has the slit 14a.

According to the second embodiment, a number of the slits 14a formed in the heat dissipation pattern 14 is less than the number of the slits 14a according to the first embodiment. Therefore, reducing the number of the slits 14a can increase the width of the part of the heat dissipation pattern 14 separated by the slit 14a.

For example, the length of each part of the side $L_1$, $L_2$ of the heat dissipation pattern 14 separated by the slit 14a shown in FIG. 6A can be more than the length of each part of the side $L_1$, $L_2$, $L_3$ of the heat dissipation pattern 14 separated by the slit 14a shown in FIG. 2A. Therefore, the length of each part of the separated side such as the lengths $L_1$, $L_2$ shown in FIG. 6A can be extended by reducing the number of the slits 14a, for example, if it is hard to satisfy the condition that the length of each part of the side $L_1$, $L_2$, $L_3$ of the heat dissipation pattern 14 separated by the slit 14a are set more than three times as long as the width Ws of the slits 14a (the maximum width if the widths are not constant).

The widths $L_1$, $L_2$ shown in FIG. 6A are typically equal. However, these may not be equal. That is, the number of the slits 14a and the number of the slits 13a can be determined corresponding to the width of the part of the conductor pattern separated by the slit in the desired conductor pattern.

Third Embodiment

The third embodiment is different from the first embodiment in the opening position of the slit in the conductor pattern. Furthermore, the explanation of the same as in the first embodiment is omitted or simplified below.

Figure 7A:
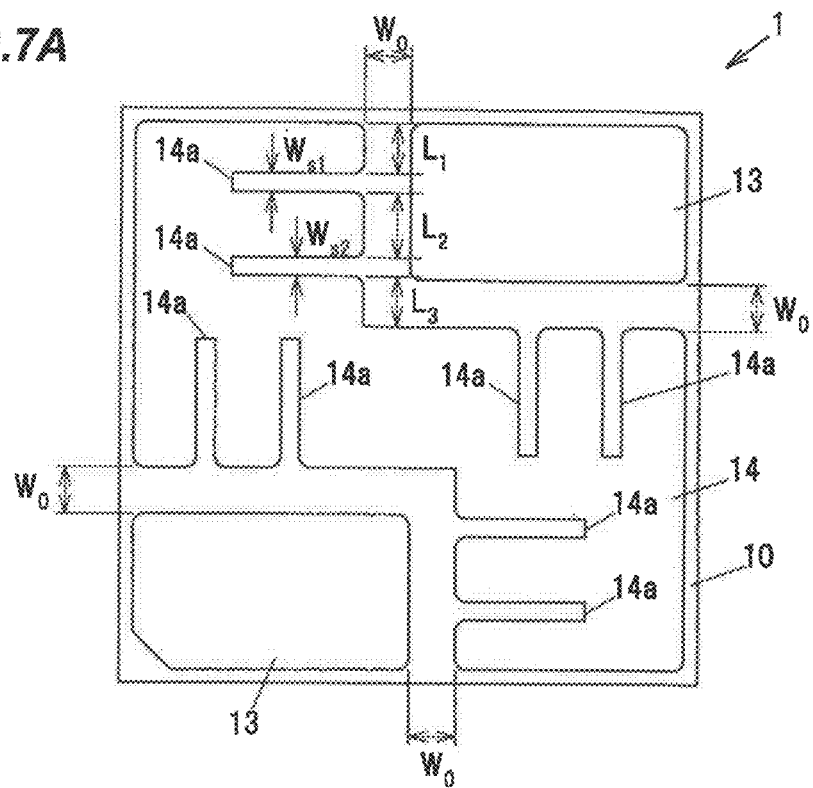
FIG. 7A is a plan view showing a rear surface side of the light emitting device showing a conductor pattern shape according to the third embodiment.
Figure 7B:
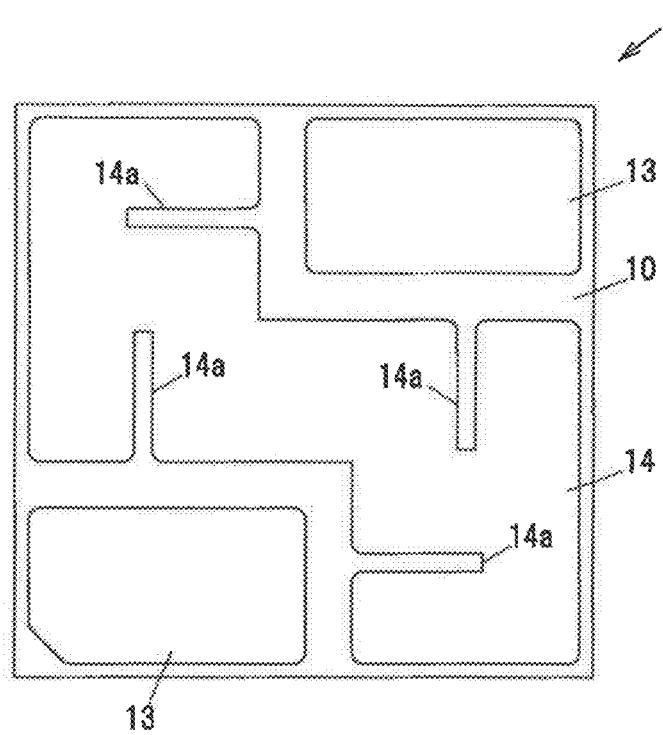
FIG. 7B is a plan view showing the rear surface side of the light emitting device showing the conductor pattern shape according to the third embodiment.

FIGS. 7A, 7B are plan views showing a rear surface side of the light emitting device 1 showing a conductor pattern shape according to the third embodiment.

FIG. 7A shows an example that the heat dissipation pattern 14 has eight slits 14a. FIG. 7B shows an example that the heat dissipation pattern 14 has four slits 14a.

As to the third embodiment, the slit 14a opens at the edge of the heat dissipation pattern 14 that is not on the outer periphery of the conductor pattern. Herein, the outer periphery of the conductor pattern means that "the outer periphery of whole conductor pattern including the conduction pattern 13 and the heat dissipation pattern 14". And every slits 14a of the heat dissipation pattern 14 open to the conduction pattern 13.

As with the slit 13a shown in FIG. 2B, if the conduction pattern 13 has the slit 13a, the slit 13a opens at the edge of the conduction pattern 13 that is not on the outer periphery of the conductor pattern. Herein, every slits 13a open to the heat dissipation pattern 14.

Inventors newly find through diligent research that "the stress concentrates at the outer periphery of the conductor pattern, especially a corner of the outer periphery". Therefore, the crack is easy to cause from the edge of the conduction pattern 13 on the outer periphery of the conductor pattern. And the crack is easy to cause from the edge of the heat dissipation pattern 14 on the outer periphery of the conductor pattern.

Figure 8:
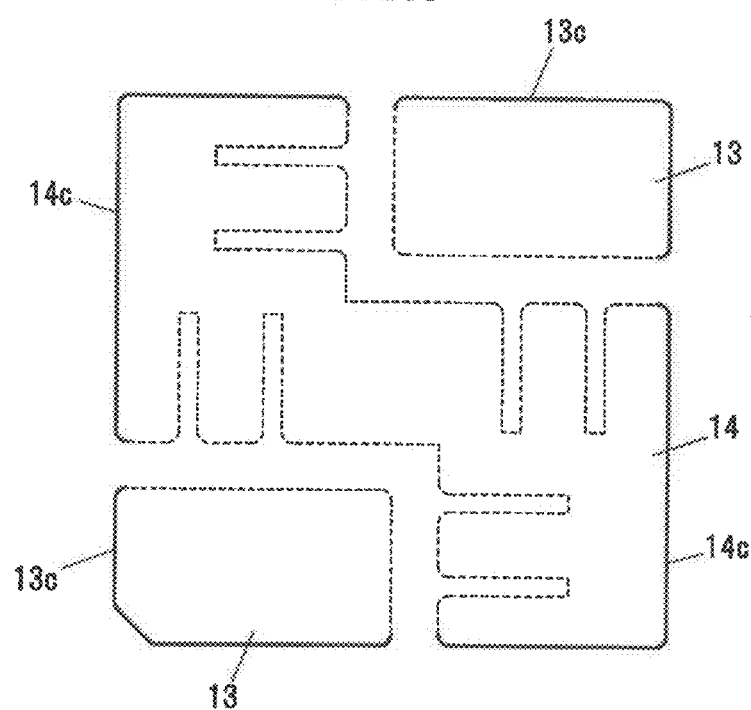
FIG. 8 is a plan view showing an outer periphery of the conductor pattern.

FIG. 8 is a plan view showing the outer periphery of the conductor pattern. The edge 14c shown in FIG. 8 with the continuous line is the edge of the heat dissipation pattern 14 that is on the outer periphery of the conductor pattern and the edge 13c is the edge of the conduction pattern 13 that is on the outer periphery of the conductor pattern.

When the slit 13a opens to the edge 13c and the slit 14a opens to the edge 14c, a number of the corners on the outer periphery of the conductor pattern increases. Thus, a number of the places where the stress concentrates increases and it may be easy to cause the crack.

Therefore, as shown in FIGS. 7A, 7B, it is preferable that the slit 14a opens to the edge of the heat dissipation pattern 14 except the edge 14c and the slit 13a opens to the edge of the conduction pattern 13 except the edge 13c.

In the third embodiment, as with the first and second embodiments, the width of the part of the conductor pattern that is separated by the slit is preferable to have certain width so as to control separating the conductor pattern caused by cracking. For example, the length of each part of the side $L_1$, $L_2$, $L_3$ of the heat dissipation pattern 14 separated by the slit 14a shown in FIG. 7A are set more than three times as long as the width $Ws_1$, $Ws_2$ of the slits 14a (the maximum width if the slit widths are not constant). Also, in some cases, the condition that the lengths $L_1$, $L_2$, $L_3$ are more than the width of the space $W_0$ between the conduction pattern 13 and the heat dissipation pattern 14 can be added. The widths $L_1$, $L_2$, $L_3$ are typically equal. However, these may not be equal.

Fourth Embodiment

The fourth embodiment is different from the first embodiment in using a hall instead of the slit in the conductor pattern. Furthermore, the explanation of the same as in the first embodiment is omitted or simplified below.

Figure 9:
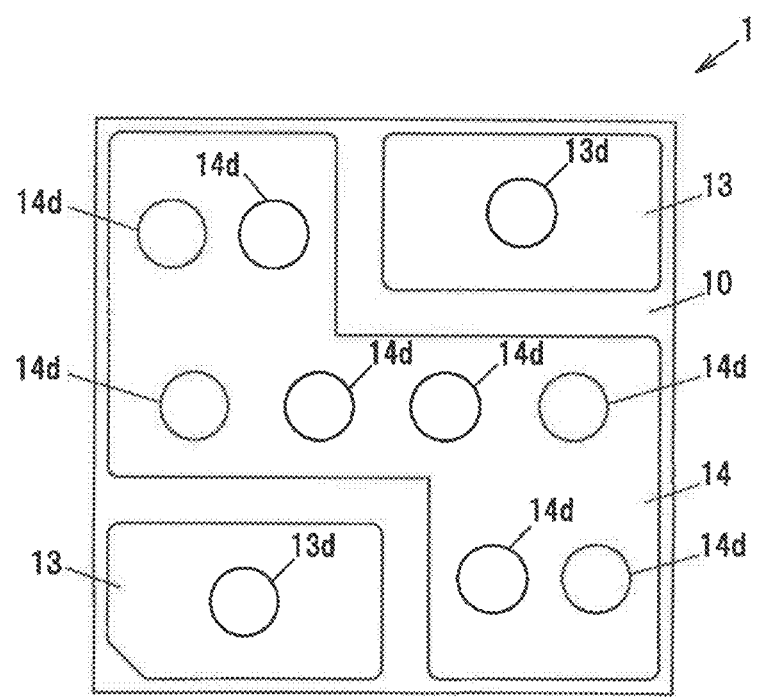
FIG. 9 is a plan view showing a rear surface side of the light emitting device showing the conductor pattern shape according to the fourth embodiment.
Figure 11A:
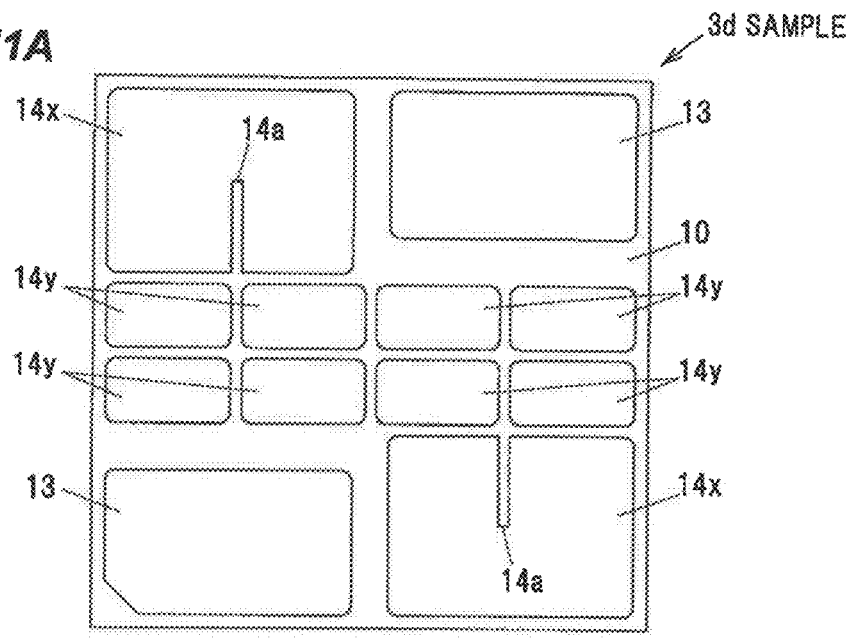
FIG. 11A is a plan view showing a conductor pattern in a sample used for the assessment according to an example 1.
Figure 11B:
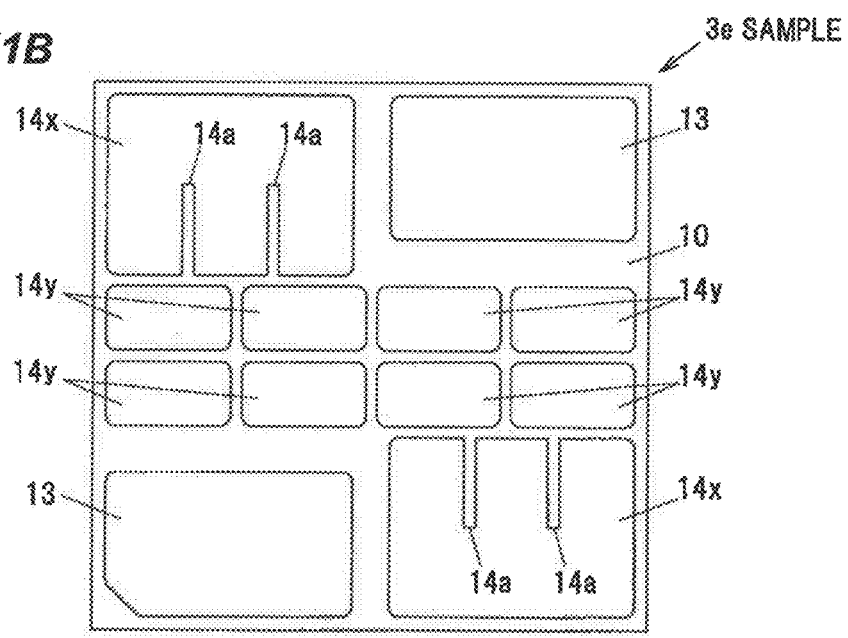
FIG. 11B is a plan view showing the conductor pattern in the sample used for the assessment according to the example 1.

FIG. 9 is a plan view showing a rear surface side of the light emitting device 1 showing the conductor pattern shape according to the fourth embodiment.

According to the fourth embodiment, a hall 13d is formed in the conduction pattern 13 and a hall 14d is formed in the heat dissipation pattern 14. The hall 13d and the hall 14d work as an escape region of the bubbles. Therefore, as with the slit 13a and the slit 14a, an adverse effect caused by remaining the bubbles at the junction between the light emitting device 1 and the housing 2 can be controlled.

The outer peripheries of the conduction pattern 13 and the heat dissipation pattern 14 also include outlines of the hall 13d and the hall 14d. Thus, as the outer peripheral length of the conduction pattern 13 and the outer peripheral length of the heat dissipation pattern 14 increase by forming the hall 13d and the hall 14d. As with the slits 13a, 14a, cracking in the conductor pattern can be controlled.

Meanwhile, each one of the hall 13d or the hall 14d may only be formed in the conductor pattern.

Advantageous Effects of Invention

According to the above embodiments, cracking the conductor pattern at the junction between the light emitting device and the housing and remaining the bubbles can be controlled. As the disconnection and the deterioration of heat dissipation performance are controlled, the life of the light emitting device can be extended.

Especially, if the light emitting device 1 has the size larger than 5×5 mm, the bubbles easily causes cracking by remaining the bubbles at the junction between the light emitting device 1 and the housing 2, and the difference in the linear expansion coefficient between the wiring substrate 10 of the light emitting device 1 and the heat dissipation substrate 20 of the housing 2 causes great adverse effect. Thus, it is more easily to cause cracking. Therefore, the above advantageous effects of invention cause great benefit.

Example 1

Next, light emitting elements having a variety of conductor pattern shapes are provided and the relation between the outer peripheral length of each part of the conductor pattern and possibility of cracking is researched.

FIGS. 10A to 11B are plan views respectively showing samples 3a to 3e used for the assessment according to the examples.

The heat dissipation patterns 14 in the samples 3a to 3e are composed of cluster with two type patterns, a heat dissipation pattern 14x and a heat dissipation pattern 14y that are different in area. The below table 1 shows the outer peripheral length of each part of the conductor pattern in samples 3a to 3e.

TABLE 1

| | Outer peripheral length | | |
|---|---|---|---|
| | Conduction pattern 13 | Heat dissipation pattern 14x | Heat dissipation pattern 14y |
| Sample 3a | 10.5 mm | 11.2 mm | 5.38 mm |
| Sample 3b | 8.3 mm | 9.0 mm | 5.30 mm |
| Sample 3c | 10.8 mm | 11.5 mm | 5.08 mm |
| Sample 3d | 10.5 mm | 13.5 mm | 5.38 mm |
| Sample 3e | 10.5 mm | 15.8 mm | 5.38 mm |

Figure 12A:
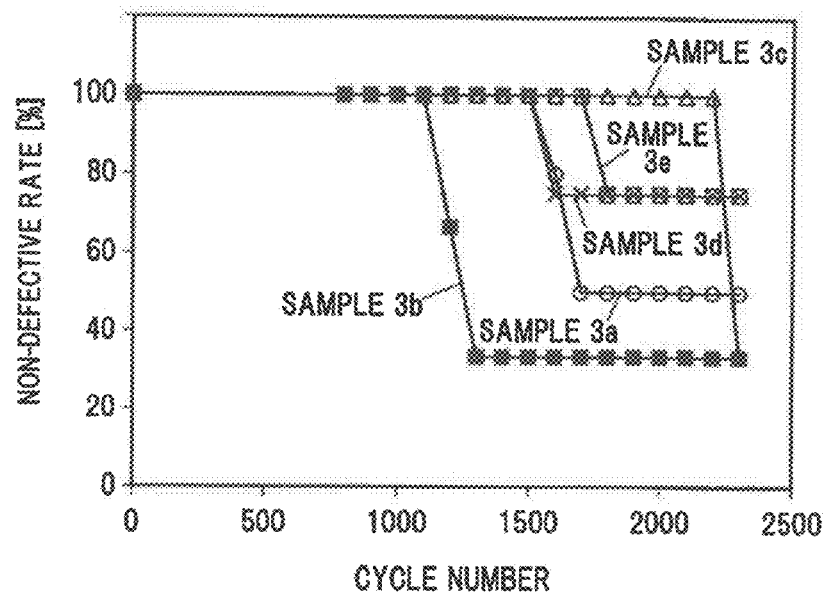
FIG. 12A is a graph showing a result of heat shock test according to the example 1.

FIG. 12A shows a graph showing the result of the heat shock test. Abscissa shown in FIG. 12A shows a cycle number of the heat shock test. Ordinate shown in FIG. 12A shows a non-defective rate.

The heat shock test is carried out based on the test 307 in JEITA ED-4701/300 (Japan Electronics and Information Technology Industries Association Standard). The heat shock test repeats exposing the samples under the temperature condition at −40° C. for 5 minutes and exposing the samples under the temperature condition at 100° C. for 5 minutes, which configure one cycle. The non-defective rate shown in FIG. 12A means "the rate in each sample 3a to 3e that is not disconnected". The disconnection is caused by separating the conduction pattern 13 by cracking.

Figure 12B:
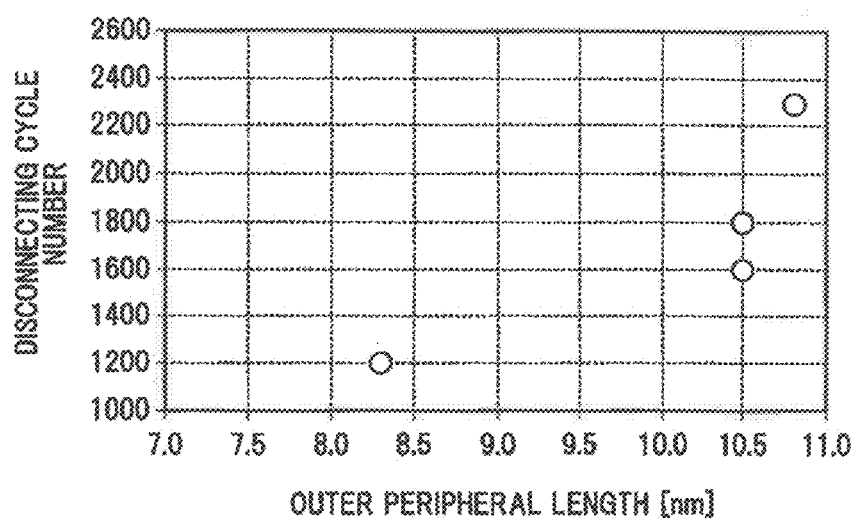
FIG. 12B is a graph showing a relation between outer peripheral length of the conduction pattern and a disconnecting cycle number of the conduction pattern resulting from the heat shock test.

FIG. 12B is a graph showing a relation between the outer peripheral length of the conduction pattern 13 and a disconnecting cycle number of the conduction pattern 13 resulting from the heat shock test. The disconnecting cycle number means the cycle number before firstly forming the disconnection in each sample 3a to 3e.

The disconnecting cycle number in the sample 3d whose outer peripheral length of the conduction pattern 13 is 8.3 mm is 1200. The reason why the disconnecting cycle number in the sample 3d is the least may be because the outer peripheral length of the conduction pattern 13 is the least in the sample 3d.

The disconnecting cycle numbers of the samples 3a, 3d, 3e whose outer peripheral lengths of the conduction patterns 13 are 10.5 mm are respectively 1600, 1600, and 1800. The reason why the disconnecting cycle numbers of these samples are close each other may be because the outer peripheral lengths of the conduction patterns 13 are similar each other.

The disconnecting cycle number of the sample 3c whose outer peripheral length of the conduction pattern 13 is 10.8 mm is 2300. The reason why the disconnecting cycle number of the sample 3c is the largest number is because the outer peripheral length of the conduction pattern 13 may be the most in the sample 3c.

For example, deserved disconnecting cycle number is set to 2000. The sample 3c whose outer peripheral length of the conduction pattern 13 is 10.8 mm is the only one that satisfies the deserved disconnecting cycle number. Thus, it is preferable that the outer peripheral length of the conduction pattern 13 is not less than 10.8 mm.

Figure 13A:
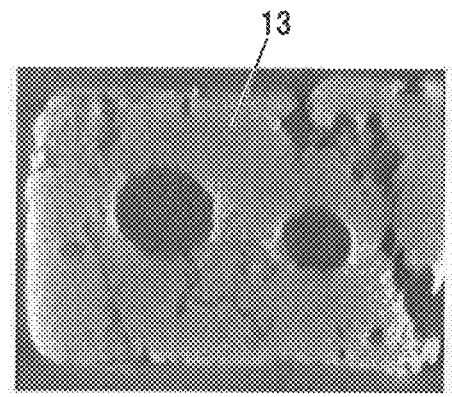
FIG. 13A is a Computed Tomography (CT) scanning image showing a conduction pattern in a disconnected sample.
Figure 13B:
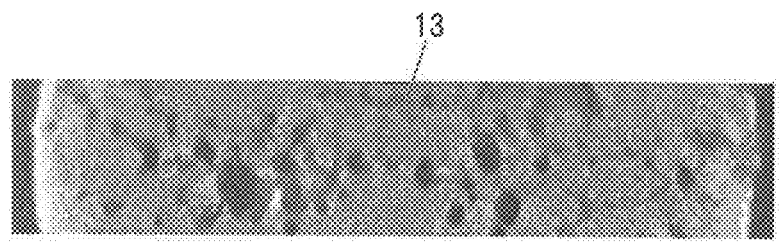
FIG. 13B is a CT scanning image showing the conduction pattern in the disconnected sample.

FIG. 13a is a Computed Tomography (CT) scanning image showing the conduction pattern 13 in the sample 3c that is firstly disconnected. FIG. 13B is a CT scanning image showing the conduction pattern 13 in the sample 3d that is firstly disconnected. The sample 3d is disconnected in the cycle number lower than the cycle number of the sample 3c. It is observed that the crack causes in whole conduction pattern 13.

Figure 13C:
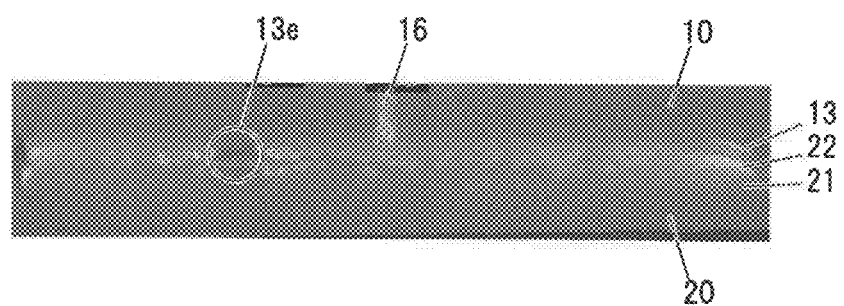
FIG. 13C is a scanning image showing a junction with the conduction pattern in the disconnected sample and a housing viewed from the side of the junction.

FIG. 13C is a scanning image showing a junction with the conduction pattern in the sample 3d, which is firstly disconnected and the housing 2 viewed from side of the junction. It is observed that the crack 13e causes from the edge 13c of the conduction pattern 13 that is on the outer peripheral edge of the conductor pattern.

Figure 14A:
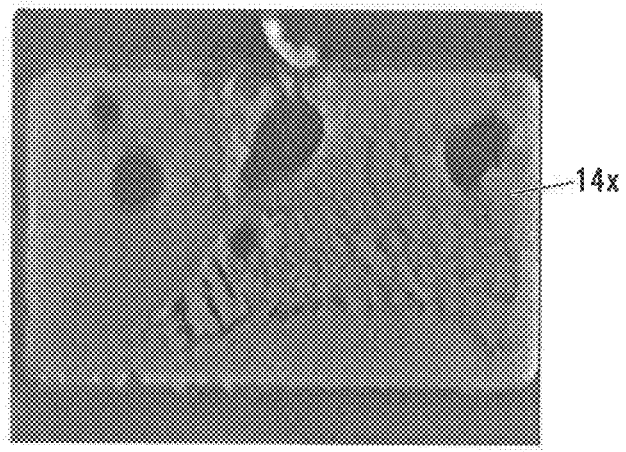
FIG. 14A is a CT scanning image showing a heat dissipation pattern in the disconnected sample.
Figure 14B:
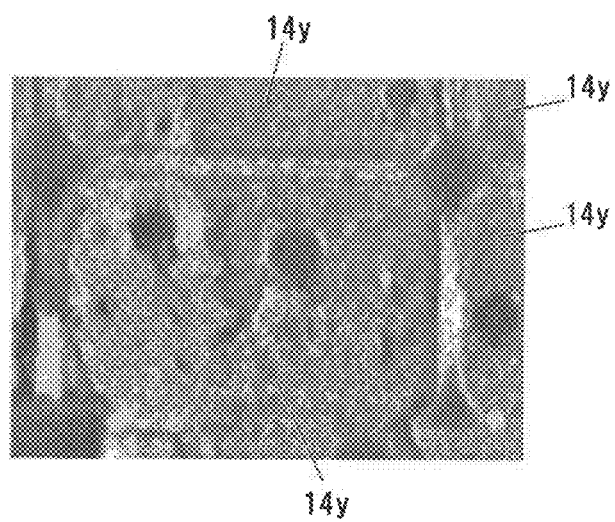
FIG. 14B is a CT scanning image showing the heat dissipation pattern in the disconnected sample.
Figure 16A:
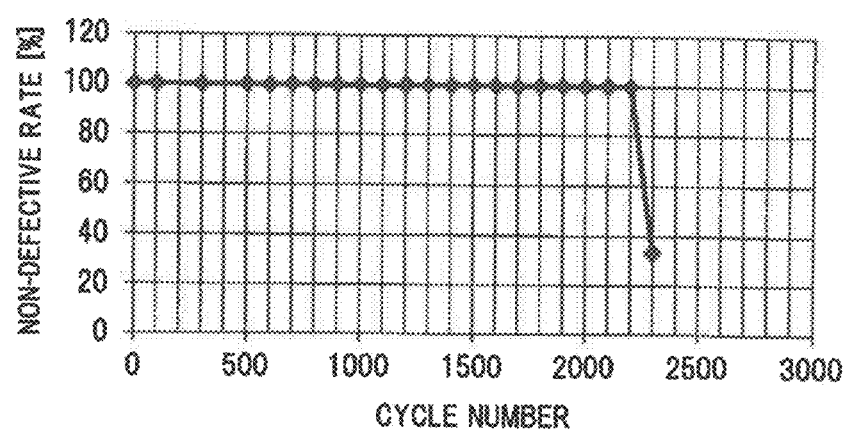
FIG. 16A is a graph showing the result of heat shock test in the sample 1 according to the example 2.
Figure 16B:
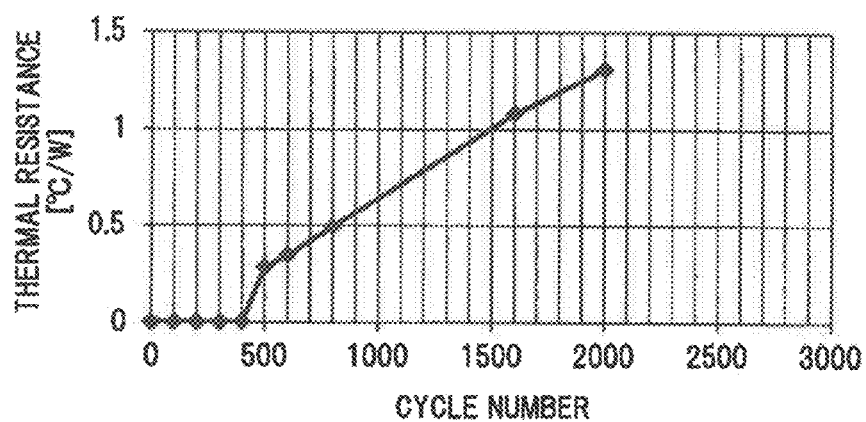
FIG. 16B is a graph showing a thermal resistance change in a solder joint in the sample 1 according to the example 2.
Figure 17A:
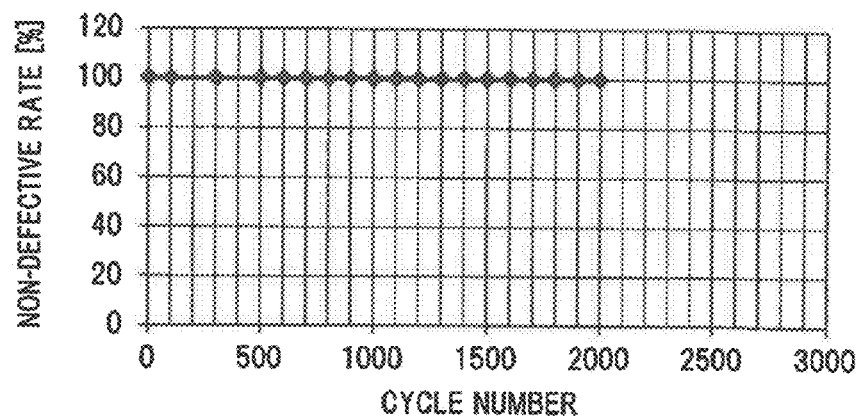
FIG. 17A is a graph showing the result of heat shock test in the sample 2 according to the example 2.
Figure 17B:
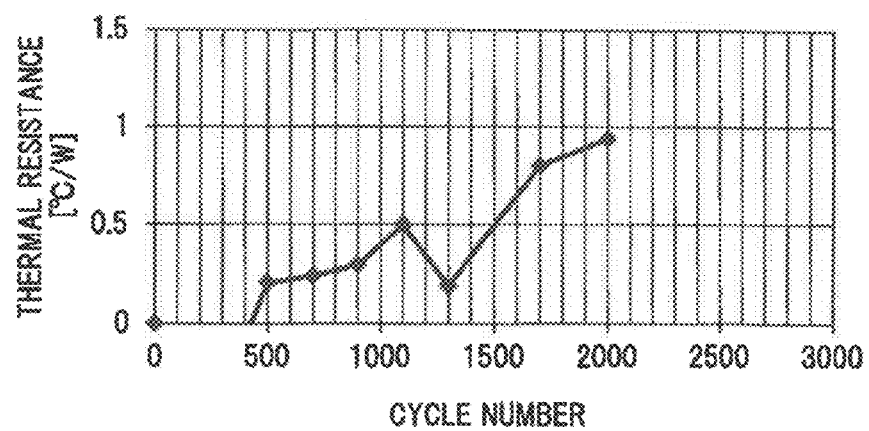
FIG. 17B is a graph showing the thermal resistance change in the solder joint in the sample 2 according to the example 2.
Figure 18A:
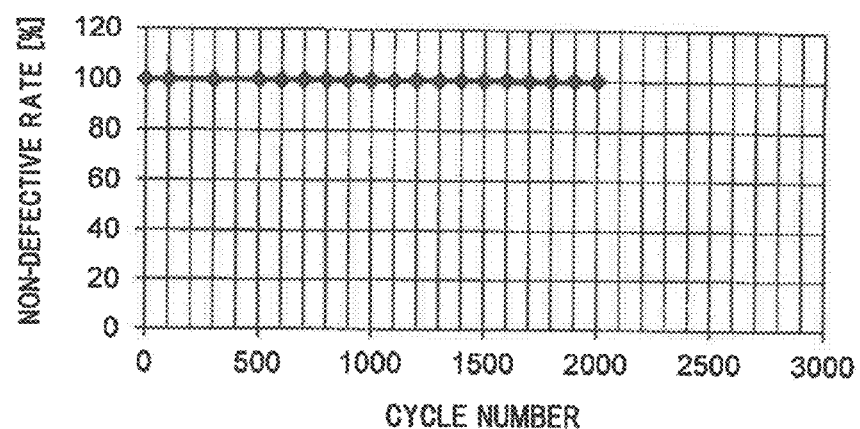
FIG. 18A is a graph showing the result of heat shock test in the sample 3 according to the example 2.
Figure 18B:
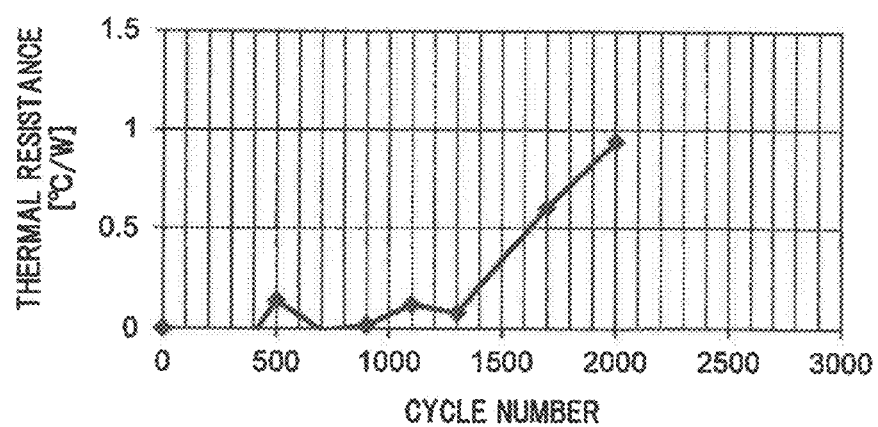
FIG. 18B is a graph showing the thermal resistance change in the solder joint in the sample 3 according to the example 2.
Figure 19A:
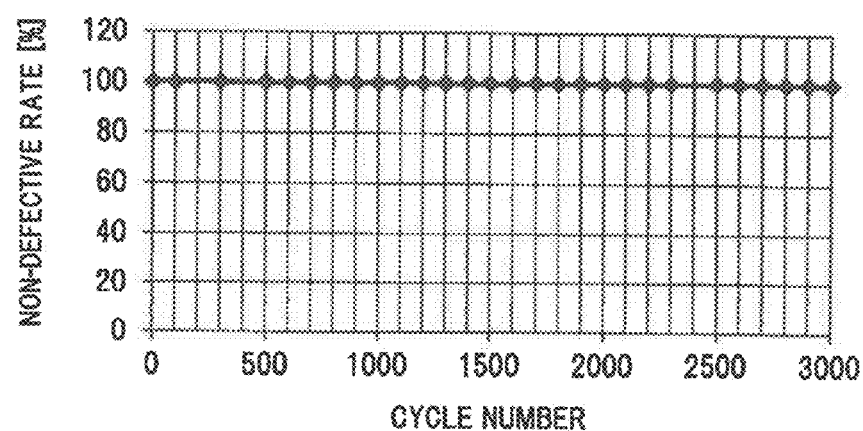
FIG. 19A is a graph showing the result of heat shock test in the sample 4 according to the example 2.
Figure 19B:
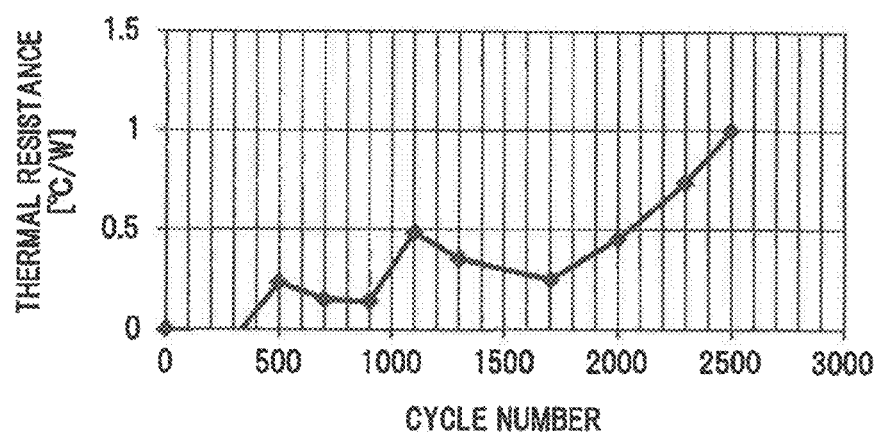
FIG. 19B is a graph showing the thermal resistance change in the solder joint in the sample 4 according to the example 2.
Figure 20A:
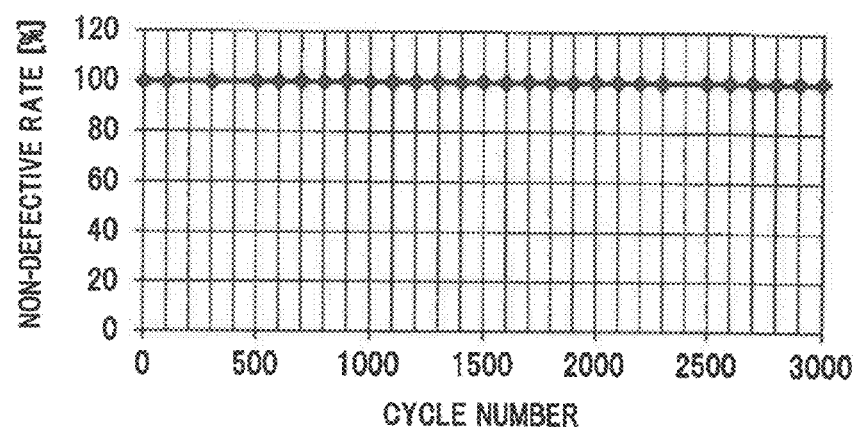
FIG. 20A is a graph showing the result of heat shock test in the sample 5 according to the example 2.
Figure 20B:
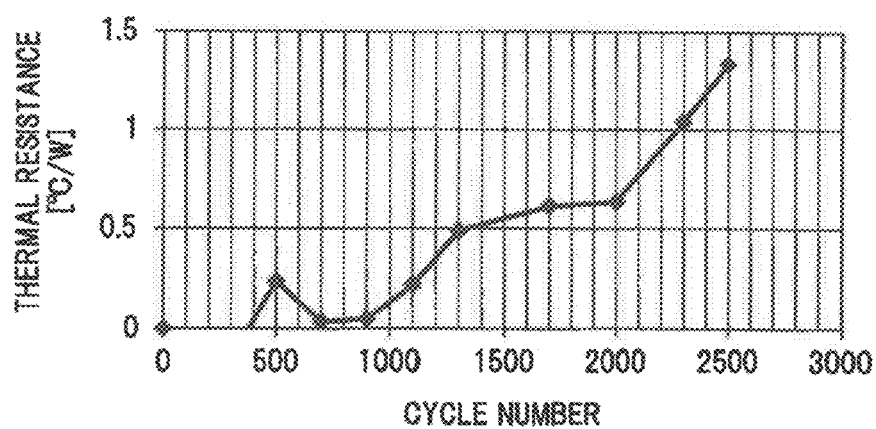
FIG. 20B is a graph showing the thermal resistance change in the solder joint in the sample 5 according to the example 2.
Figure 21A:
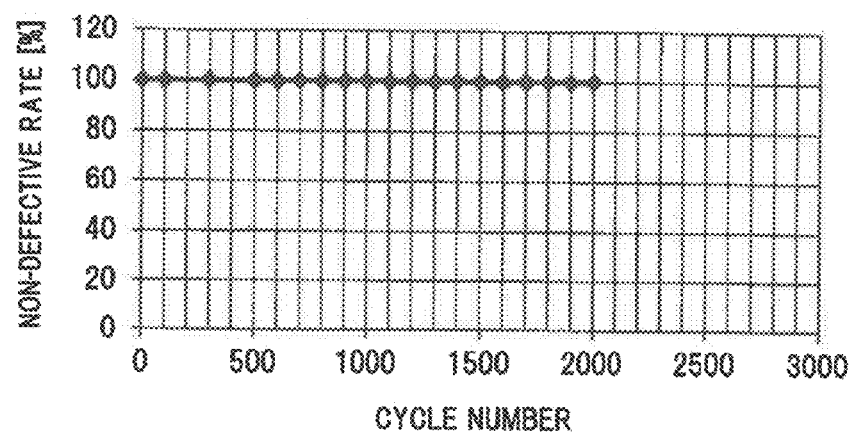
FIG. 21A is a graph showing the result of heat shock test in the sample 6 according to the example 2.
Figure 21B:
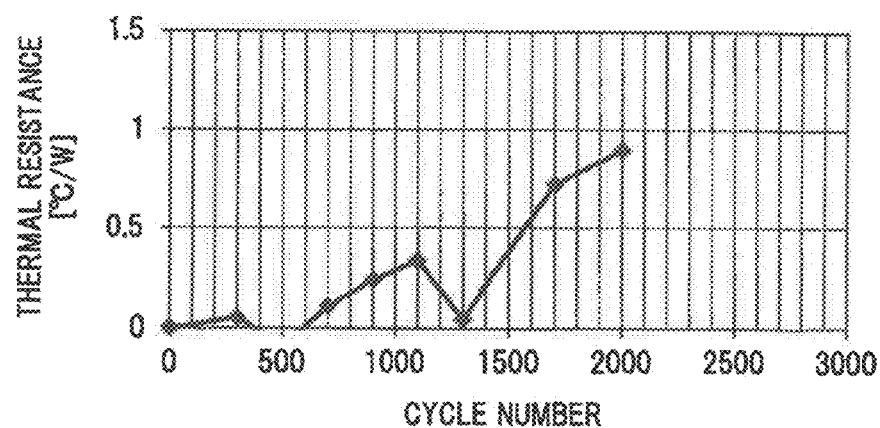
FIG. 21B is a graph showing the thermal resistance change in the solder joint in the sample 6 according to the example 2.
Figure 22A:
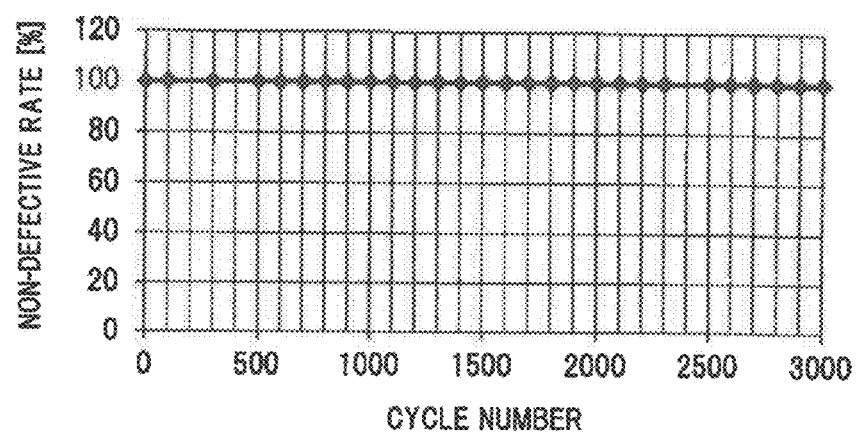
FIG. 22A is a graph showing the result of heat shock test in the sample 7 according to the example 2.
Figure 22B:
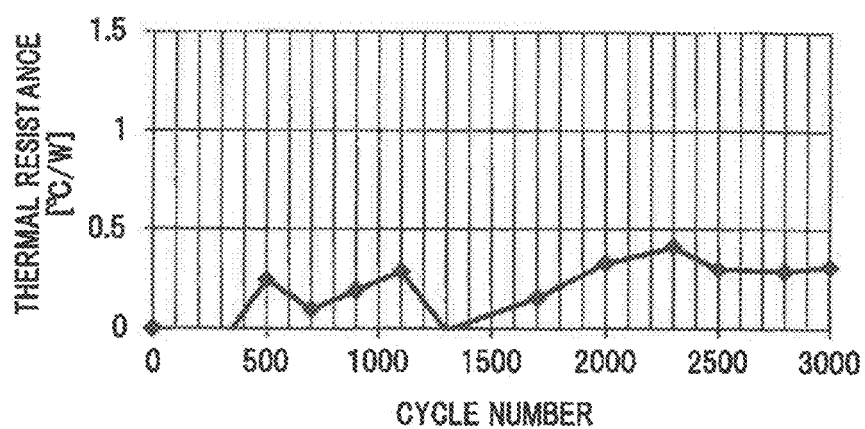
FIG. 22B is a graph showing the thermal resistance change in the solder joint in the sample 7 according to the example 2.
Figure 23A:
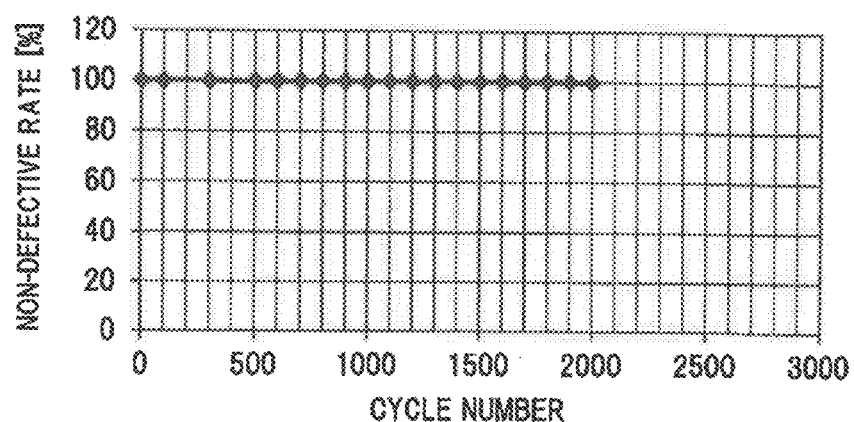
FIG. 23A is a graph showing the result of heat shock test in the sample 8 according to the example 2.
Figure 23B:
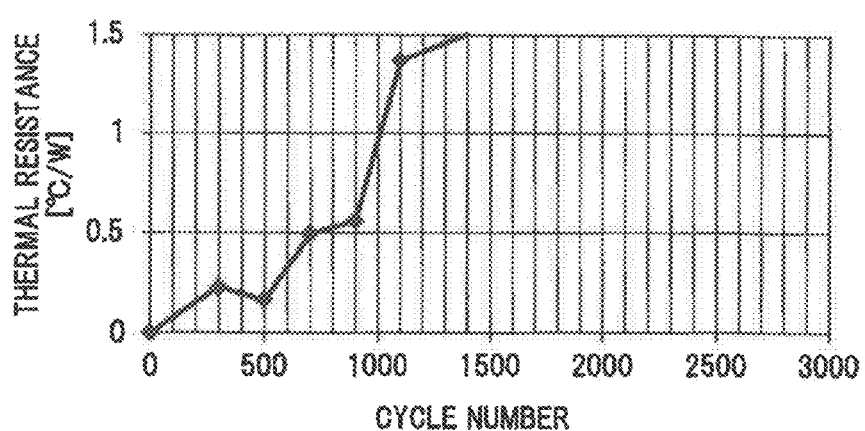
FIG. 23B is a graph showing the thermal resistance change in the solder joint in the sample 8 according to the example 2.

FIGS. 14A, 14B are CT scanning images showing the heat dissipation patterns 14x, 14y of the sample 3c that is firstly disconnected. The crack over the whole heat dissipation pattern 14y is observed. Meanwhile, the crack in the whole heat dissipation pattern 14x fails to be observed. It may be caused by the outer peripheral length of the heat dissipation pattern 14y that is less than the outer peripheral length of the heat dissipation pattern 14x.

FIGS. 15A, 15B are graphs showing relations between thermal resistance and thermal capacity at each part of the sample 3a and the housing 2.

Each region $R_1$, $R_2$, $R_3$ shown in FIG. 15A respectively shows the thermal resistance of the insulating substrate 21 made of glass epoxy, the heat dissipation substrate 20, and nearby the interface between the heat dissipation substrate 20 and air. Each region $R_4$, $R_5$, $R_6$, $R_7$ respectively shows the thermal resistance at the light emitting element 11, the junction between the electrode 12 and the wiring 15 (AuSnAg junction), the wiring substrate 10 made of AlN, and the junction of the conductor pattern that is made of solder between the light emitting device 11 side conductor pattern made of Cu and the housing 2 side conductor pattern made of Cu.

FIG. 15C is a graph showing a thermal resistance change in the junction made of solder between the light emitting device 1 side conductor pattern made of Cu and the housing 2 side conductor pattern made of Cu in the samples 3a to 3e. The thermal resistance change is accounted by thermal transient measuring.

FIG. 15C shows that each sample increases the thermal resistance when the cycle number in the thermal transient measuring is more than 500.

Example 2

Next, the light emitting elements having conductor patterns according to the first to fourth embodiments are provided and each non-defective rate and thermal resistance change are researched.

The below table 2 shows the outer peripheral length of each part, minimum pattern width, and number of samples in the samples 1 to 8 according to the examples. In this case, the conductor patterns in the samples 1 to 8 are respectively the conductor patterns shown in FIG. 4, FIG. 2A, FIG. 2B, FIG. 6A, FIG. 6B, FIG. 7A, FIG. 7B, and FIG. 9.

"The minimum pattern width" described above means "the width of the narrowest part in the conductor pattern". For example, the minimum pattern width is equal to the lengths $L_1$, $L_2$, $L_3$ shown in FIG. 2A according to the sample 2. "The total number of samples" means "the number of samples used for the test to research the non-defective rate". For the conductor pattern in the sample 1, the table 2 shows the minimum length of the outer peripheral length since the conductor pattern in the sample 1 is separated into the plurality of conductor patterns.

TABLE 2

| | | Outer peripheral length | | | |
| | FIG. | Conduction pattern 13 | Heat dissipation pattern 14 | Minimum pattern width | Total number of samples |
| --- | --- | --- | --- | --- | --- |
| Sample 1 | FIG. 4 | 10.8 mm | 5.1 mm | 0.875 mm | 3 |
| Sample 2 | FIG. 2A | 9.05 mm | 44.9 mm | 0.7 mm | 6 |
| Sample 3 | FIG. 2B | 12.85 mm | 44.9 mm | 0.7 mm | 7 |
| Sample 4 | FIG. 6A | 9.05 mm | 34.1 mm | 1.125 mm | 5 |
| Sample 5 | FIG. 6B | 10.95 mm | 34.1 mm | 1.125 mm | 6 |
| Sample 6 | FIG. 7A | 9.05 mm | 44.9 mm | 0.7 mm | 4 |
| Sample 7 | FIG. 7B | 9.05 mm | 34.1 mm | 1.125 mm | 6 |
| Sample 8 | FIG. 9 | 11.3 mm | 41.6 mm | 0.31 mm | 4 |

FIGS. 16A to 23A are graphs respectively shows the result of the heat shock test according to the samples 1 to 8. Abscissas in FIGS. 16A to 23A show cycle numbers of the heat shock test. Ordinates in FIGS. 12A to 23A show non-defective rates.

The heat shock test is carried out based on the test 307 in JEITA ED-4701/300. The heat shock test repeats exposing the samples under the temperature condition at −40° C. for 5 minutes and exposing the samples under the temperature condition at 100° C. for 5 minutes, which configure the one cycle. The non-defective rate shown in FIGS. 16A to 23A means "the rate in each sample 1 to 8 that is not disconnected (the rate of "the total number of samples" to the number of connected samples)". The disconnection is caused by separating the conduction pattern 13 by cracking.

As shown in FIGS. 16A to 23A, each sample 1 to 8 have the non-defective rate that is 100% until 2000 cycles. Therefore, it is observed that the conduction pattern 13 has enough thermal shock resistance. It may be caused by the conductor patterns 13 in each sample 1 to 8 having enough outer peripheral length (not less than 9.05 mm).

Moreover, it is observed that the bubbles remaining in the conduction pattern 13 is controlled in the samples 3, 5 in which the conduction pattern 13 has the slit 13a. It may be caused by easily emitting the bubbles by disposing the slit 13a in the conduction pattern 13.

FIGS. 16B to 23B are graphs showing the thermal resistance change of the joint made of solder between the light emitting device 1 side conductor pattern made of Cu and the housing 2 side conductor pattern made of Cu. The thermal resistance change is accounted by the thermal transient measuring As shown in FIGS. 16B to 23B, it is confirmed that thermal resistance rising can be controlled in the samples 2 to 7 having the slit 14a in the heat dissipation pattern 14 comparing with the samples 1, 8 that fails to include the slit 14a in the heat dissipation pattern 14. It may be caused by increasing the outer peripheral length of the heat dissipation pattern 14 by forming the slit 14a.

As to the samples 4, 5, 7 having relatively large minimum pattern width, it is confirmed that the thermal resistance rising can be controlled effectively. It may be caused by hardly separating the heat dissipation pattern 14 while the crack causes in the heat dissipation pattern 14 since the whole heat dissipation pattern 14 has certain width. Therefore, it is preferable that the width of the narrowest part in the heat dissipation pattern 14 is not less than 1.125 mm. That is, it is preferable that the width of the heat dissipation pattern 14 in whole region is not less than 1.125 mm.

Also, it is preferable that the width of the narrowest part of the conduction pattern 13 is not less than 1.125 mm so as to control separating the conduction pattern 13 caused by cracking. Therefore, it is preferable that the width of the narrowest part of the conductor pattern including the heat dissipation pattern 14 and the conduction pattern 13 is not less than 1.125 mm. That is, it is preferable that the width of the whole conductor pattern that is not less than 1.125 mm is ensured.

As to the sample 8, the thermal resistance rising may hardly be controlled effectively while the separation caused by cracking fails to be controlled since the width of the region of the heat dissipation pattern 14 nearby the hall 14*d* is narrow.

Furthermore, the thermal resistance rising in the sample 7 is most effectively controlled from the samples 4, 5, and 7. It may be caused by opening the slit 14*a* of the heat dissipation pattern 14 to the conductor pattern 13 and opening on the edge of the heat dissipation pattern 14 that is not on the outer peripheral edge of the conductor pattern.

Although the embodiments have been described, the invention is not intended to be limited to the embodiments. The various kinds of modifications can be implemented without departing from the gist of the invention.

For example, although the above embodiments show examples that the conductor patterns have the conduction pattern and the heat dissipation pattern. The structure or application of the conductor pattern is not limited to thereof. It is caused by observing the problem such as cracking regardless of the structure or the application of the conduction pattern.

Also, this invention is not limited to apply to the light emitting device shown in the above embodiments. This invention can be applied to any electronic components having the conductor pattern to be installed in the housing on the rear surface of the substrate. For example, especially, the present invention can be applied to a semiconductor element such as GaN type semiconductor element (Power device).

Also, the claimed invention is not intended to be limited to the embodiments. Further, it should be noted that all combinations of the features described in the embodiments and the Examples are not necessary to solve the problems of the invention.

What is claimed is:

1. A light emitting device, comprising:
   a wiring substrate;
   a light emitting element disposed on a front surface of the wiring substrate; and
   a conductor pattern formed on a rear surface of the wiring substrate,
   wherein the conductor pattern comprises a slit or a hole that fails to separate the conductor pattern into two parts,
   wherein the rear surface of the wiring substrate is configured to be mounted parallel to a conductor pattern surface of an outside housing for mounting the light emitting device thereon,
   wherein the electronic component does not include any side-emission type of light emitting device,
   wherein the conductor pattern comprises a conduction pattern that is electrically connected to the light emitting element and a heat dissipation pattern, and
   wherein, in a plan view, the light emitting element overlaps with the conduction pattern.

2. The light emitting device according to claim 1, wherein the slit opens at an edge of the conductor pattern that is not on an outer periphery of the conductor pattern.

3. The light emitting device according to claim 1, wherein the slit opens in the heat dissipation pattern toward the conduction pattern.

4. The light emitting device according to claim 1, wherein a length of each part of a side of the conductor pattern separated by the slit is not less than three times as long as a width of the slit.

5. The light emitting device according to claim 1, wherein a width of a narrowest part of the conductor pattern is not less than 1.125 mm.

6. The light emitting device according to claim 1, wherein the conduction pattern and the heat dissipation pattern include a same material.

7. The light emitting device according to claim 1, further comprising:
   a patterned film comprising the conductor pattern,
   wherein the patterned film extends below opposing edges of the light emitting element, and
   wherein the patterned film is disposed below an entirety of the light emitting element.

8. The light emitting device according to claim 7, wherein the patterned film comprises a single film that is disposed below the entirety of the light emitting element.

9. The light emitting device according to claim 1, further comprising:
   a phosphor layer disposed on a top surface of the light emitting element.

10. The light emitting device according to claim 9, wherein the phosphor layer is further disposed on a side surface of the light emitting element.

11. The light emitting device according to claim 10, wherein the phosphor layer is further disposed on the front surface of the wiring substrate.

12. The light emitting device according to claim 9, further comprising:
    a resin material disposed on a surface of the phosphor layer.

13. The light emitting device according to claim 1, further comprising:
    a via hole extending through the wiring substrate to electrically meet the light emitting element to the conduction pattern.

14. The light emitting device according to claim 13, wherein the via hole is disposed below the light emitting element.

15. The light emitting device according to claim 13, wherein, in the plan view, the via hole overlaps with the light emitting element and the conduction pattern.

16. The light emitting device according to claim 13, wherein, in a cross-sectional view, the via hole is located away from the heat dissipation pattern.

* * * * *